US005683565A

United States Patent [19]
Florio et al.

[11] Patent Number: 5,683,565
[45] Date of Patent: *Nov. 4, 1997

[54] ELECTROPLATING PROCESS

[75] Inventors: Steven M. Florio, Hopkinton; Jeffrey P. Burress, Milford; Carl J. Colangelo, New Bedford; Edward C. Couble, Brockton; Mark J. Kapeckas, Worcester, all of Mass.

[73] Assignee: Shipley Company, L.L.C., Marlborough, Mass.

[*] Notice: The term of this patent shall not extend beyond the expiration date of Pat. No. 5,611,905.

[21] Appl. No.: 652,152

[22] Filed: May 23, 1996

Related U.S. Application Data

[63] Continuation-in-part of Ser. No. 488,943, Jun. 9, 1995, Pat. No. 5,611,905.

[51] Int. Cl.$^6$ ............................. C25D 15/00; C25D 5/02; C23C 5/10; H01B 1/04
[52] U.S. Cl. ........................... 205/109; 205/118; 205/125; 205/183; 205/210; 252/502
[58] Field of Search ..................... 205/109, 118, 205/125, 183, 210; 252/502

[56] References Cited

U.S. PATENT DOCUMENTS

| | | | |
|---|---|---|---|
| 2,897,409 | 10/1959 | Gitto | 174/257 |
| 4,619,741 | 10/1986 | Minten et al. | 205/125 |
| 4,897,164 | 1/1990 | Piano et al. | 205/125 |
| 5,389,270 | 2/1995 | Thom et al. | 252/22 |

*Primary Examiner*—Kathryn L. Gorgos
*Assistant Examiner*—Edna Wong
*Attorney, Agent, or Firm*—Robert L. Goldberg

[57] ABSTRACT

A process for electroplating a substrate by coating the substrate with a coating of conductive particles. The coating of conductive particles is applied to the substrate from an aqueous dispersion containing a dissolution agent for metallic regions of the substrate. The dissolution agent removes the top surface of the metal as the conductive particle coating is formed thereby facilitating removal of the same from the metallic regions of the substrate.

5 Claims, No Drawings

ELECTROPLATING PROCESS

This application is a continuation-in-part of application application Ser. No. 08/488,943 filed on Jun. 9, 1995, now U.S. Pat. No. 5,611,905.

BACKGROUND OF THE INVENTION

1. Introduction

This invention relates to a process for electroplating substrates having metallic and non-metallic regions. More particularly, this invention relates to a step of metallization in printed circuit board manufacture where a copper clad non-conducting substrate is provided with a conductive coating while the surface of the copper cladding is simultaneously dissolved to reduce deposition of the conductive coating material on the surfaces of the copper cladding.

2. Description of the Prior Art

Nonconductor surfaces are conventionally metallized by a sequence of steps comprising catalysis of the surface of the nonconductor to render the same catalytic to electroless metal deposition followed by contact of the catalyzed surface with an electroless plating solution that deposits metal over the catalyzed surface in the absence of an external source of electricity. Metal plating continues for a time sufficient to form a metal deposit of the desired thickness. Following electroless metal deposition, the electroless metal deposit is optionally enhanced by electrodeposition of metal over the electroless metal coating to a desired thickness. Electrolytic deposition is possible because the electroless metal deposit serves as a conductive coating that permits electroplating.

Catalyst compositions useful for electroless metal plating are known in the art and disclosed in numerous publications including U.S. Pat. No. 3,011,920, incorporated herein by reference. The catalyst of this patent consists of an aqueous suspension of a tin—noble catalytic metal colloid. Surfaces treated with such catalysts promote the generation of electrolessly formed metal deposits by the oxidation of a reducing agent in an electroless plating solution catalyzed by the catalytic colloid.

Electroless plating solutions are aqueous solutions containing both a dissolved metal and a reducing agent in solution. The presence of the dissolved metal and reducing agent together in solution results in plate out of the metal in contact with a catalytic metal tin catalyst. However, the presence of the dissolved metal and reducing agent together in solution may also result in solution instability and indiscriminate deposition of metal on the walls of containers for such plating solutions. This may necessitate interruption of the plating operation, removal of the plating solution from the tank and cleaning of tank walls and bottoms by means of an etching operation. Indiscriminate deposition may be avoided by careful control of the plating solution during use and by use of stabilizers in solution which inhibit indiscriminate deposition, but which also retard plating rate.

Attempts have been made in the past to avoid the use of an electroless plating solution by a direct plating process whereby a metal may be deposited directly over a treated nonconductive surface. One such process is disclosed in U.S. Pat. No. 3,099,608, incorporated herein by reference. The process disclosed in this patent involves treatment of the nonconductive surface with a tin-palladium colloid which forms an essentially nonconductive film of colloidal palladium particles over the nonconductive surface. This is the same tin-palladium colloid used as a plating catalyst for electroless metal deposition. For reasons not fully understood, it is possible to electroplate directly over the catalyzed surface of the nonconductor from an electroplating solution though deposition occurs by propagation and growth from a conductive surface. Therefore, deposition begins at the interface of a conductive surface and the catalyzed nonconductive surface. The deposit grows epitaxially along the catalyzed surface from this interface. For this reason, metal deposition onto the substrate using this process is slow. Moreover, deposit thickness is uneven with the thickest deposit occurring at the interface with the conductive surface and the thinnest deposit occurring at a point most remote from the interface.

An improvement in the process of U.S. Pat. No. 3,099,608 is described in U.K Pat. No. 2,123,036 B, incorporated herein by reference. In accordance with the process described in this patent, following catalysis, a surface is electroplated from an electroplating solution containing an additive that is said to inhibit deposition of metal on the metal surface formed by plating without inhibiting deposition on the metallic sites over the nonconductive surface. In this way, there is said to be preferential deposition over the metallic sites with a concomitant increase in the overall plating rate. In accordance with the patent, the metallic sites are preferably formed in the same manner as in the aforesaid U.S. Pat. No. 3,099,608—i.e., by immersion of the nonconductive surface in a solution of a tin-palladium colloid. The additive in the electroplating solution responsible for inhibiting deposition is described as one selected from a group of dyes, surfactants, chelating agents, brighteners, and leveling agents. Many of such materials are conventional additives for electroplating solutions.

There are limitations to the above process. Both the processes of the U.S. and U.K. patents for electroplating require conductive surfaces for initiation and propagation of the electroplated metal deposit. For this reason, the processes are limited in their application to metal plating solutions of nonconductive substrates in areas in close proximity to a conductive surface. In addition, in practice, it has been found that the surface provided with metallic sites is not robust and does not stand up to those chemical treatment compositions used prior to the step of electroplating. For this reason, when the process is used for the manufacture of printed circuit boards, void formation is a significant problem resulting in rejection of circuit boards manufactured by the process.

Improvements in processes for direct electroplating of nonconductors that overcome the deficiencies in the processes of U.S. Pat. No. 3,099,608 and in U.K. Pat. No. 2,123,036 are disclosed in U.S. Pat. Nos. 4,895,739; 4,919, 768; 4,952,286; and 5,276,290, all incorporated herein by reference. In accordance with the processes of these patents, an electroless plating catalyst, such as that disclosed in the aforesaid U.K. patent, is treated with an aqueous solution of a chalcogen, such as a sulfur solution, to convert the catalyst surface to a chalcogenide surface. By conversion of the surface to the chalcogenide conversion coating, the coating formed is both more robust and more conductive and electroless plating catalyst does not desorb from the surface during metallization. Consequently, in accordance with the process of said patents, it is possible to form printed circuit boards using formulations that would otherwise attack the catalyst layer such as those solutions used in patterned plating processes.

The processes of the aforementioned patents provide a substantial improvement over the process of the U.K. Patent. However, it has also been found that treatment of an absorbed catalytic metal on a substrate having both nonconductive portions and metallic portions, such as a printed circuit board substrate, with a sulfide solution results in a formation of a sulfide on metal surfaces in contact with the solution of the sulfide precursor solution. Therefore, if the process is used in the manufacture of printed circuit boards, both the catalytic metal and the copper cladding or conductors of the printed circuit board base material are converted to a tenaciously adherent sulfide. If the copper sulfide is not removed prior to electroplating, it may reduce the bond strength between the copper and a subsequently deposited metal over the copper.

An alternative method for direct electroplating of nonconductors is disclosed in U.S. Pat. No. 4,619,741, incorporated herein by reference. In accordance with the procedures of this patent, a nonconductive substrate is coated with a dispersion of carbon black and then dried. The coating is removed from surfaces where plating is undesired and the remaining portions of the substrate are plated using procedures similar to those described in the aforesaid references. There are several problems inherent in this procedure. For example, carbon black is a poor conductor of electricity, and consequently, before forming the carbon black dispersion, in practice, it is believed that the carbon black particles must be treated with an organic ionomer or polymer to enhance conductivity. In addition, during processing, and prior to electroplating, the carbon black dispersion is only poorly adhered to the underlying substrate and has a tendency to flake off of the substrate prior to the plating step. This results in void formation during plating. In addition, because of the poor adherence to the substrate, subsequent to plating, there is a tendency for the metal deposit to separate from the substrate. This can lead to interconnect defects between a metallized hole and an innerlayer in multilayer printed circuit fabrication.

A more recently utilized direct plate process for metallizing the walls of hole-walls employs dispersions of graphite for the formation of a conductive coating. The use of graphite to form conductive coatings on through-hole walls is known and disclosed in U.S. Pat. No. 2,897,409 incorporated herein by reference. Current processes are disclosed, for example, in U.S. Pat. Nos. 4,619,741 and 5,389,270, each incorporated herein by reference. In accordance with the procedures set forth in these patents, a dispersion of carbon black or graphite is passed through the through-holes to form a coating of the dispersion on the hole-walls. The coating is dried to yield a conductive layer of the carbon black or graphite which is sufficiently conductive for electroplating in a conventional manner.

In the above process, because carbon and graphite are less conductive than metal and the coatings formed using dispersions of these materials are relatively porous, it is necessary to deposit a relatively thick layer of the dispersion on the substrate to provide adequate conductivity for electrolytic deposition. To increase the thickness of the coating on a substrate, a typical pretreatment procedure involves contact of a substrate with a polyelectrolyte which is a material having surfactant properties that causes the polyelectrolyte to bond to nonconducting surfaces with a tail extending outward having a charged end opposite the charge of the dispersed particles within the dispersion. This increases adsorption of the particles onto the surface of the substrate when the substrate is immersed in the dispersion thereby increasing the thickness of the deposit. A difficulty with the process is that the polyelectrolyte also adsorbs onto copper surfaces resulting in formation of a heavy deposit of the carbonaceous particles on all exposed copper surfaces. This carbonaceous coating on the copper must be removed prior to electrolytic deposition. Otherwise, the coating will interfere with the bond strength between the copper surface of the substrate and a subsequently deposited electrolytic metal deposit. The method for removing the carbon coating from the copper involves etching of the copper to undercut the carbon coating following by rinsing with pressurized water. These steps are laborious and often disrupt the carbonaceous coating on the nonconducting surfaces to be electrolytically plated resulting in plating defects.

SUMMARY OF THE INVENTION

The present invention is directed to an improved process for the direct electroplating of a printed circuit board substrate using a dispersion of carbon black or graphite particles, hereinafter referred to collectively as a carbonaceous coating or a carbonaceous dispersion. In accordance with the invention, a copper dissolution agent is combined with the carbonaceous dispersion whereby the step of applying the carbonaceous dispersion to a substrate results in decreased deposition of the carbonaceous coating material on copper surfaces and facilitates removal of the carbonaceous coating following its formation on the copper surfaces.

In operation, though not wishing to be bound by theory, it is believed that when a copper clad circuit board substrate is contacted with a dispersion of the carbonaceous coating material, the particles comprising the dispersion are attracted to and adsorb on all surfaces of the substrate by an oppositely charged polyelectrolyte adsorbed over the entire surface of the substrate. However, as the coating forms, simultaneously, the dissolution agent for copper contained in the dispersion dissolves the top surface of the copper and undercuts the polyelectrolyte desorbing it from copper surfaces, but not from the nonconducting surfaces which remain unaffected by the copper dissolution agent. Consequently, the polyelectrolyte desorbs from the copper surfaces reducing attraction of the dispersed carbonaceous materials to the copper surfaces and reduces the bond between the copper surfaces and adsorbed carbon particles. This reduces the mount of particles adsorbed onto the copper and permits adsorbed particles to be more readily removed.

It is unexpected that a copper dissolution agent may be combined with the carbonaceous dispersion for several reasons. First, stable dispersions of carbon or graphite are difficult to form. To form a stable dispersion—one where the particles do not separate from the dispersion upon standing, it is necessary to obtain the appropriate charge on the suspended particles. To do so, pH control is important. It would be expected that the addition of a dissolution agent such as an amine would interfere with charge thus resulting in an unstable dispersion. In addition, to dissolve copper, it is necessary for the dissolution agent to come into sustained and direct contact with the copper surface to be dissolved. When the dissolution agent is combined with the carbonaceous dispersion, it might be expected that the carbon would coat the surface of the copper before the copper could be adequately dissolved. However, in practice, it has been found that adequate dissolution of copper takes place simultaneously with the formation of the carbon coating on the surface of the copper.

DESCRIPTION OF THE PREFERRED EMBODIMENTS

The subject invention is suitable for the manufacture of a variety of commercial articles where a metal deposit is desired over a surface of a nonconductor. However, the invention is especially useful for fabrication of printed circuit boards having copper cladding over at least one surface of a printed circuit board substrate. For this reason, the description that follows is directed primarily to printed circuit board manufacture.

In printed circuit board manufacture, the substrate commonly used is an epoxy substrate filled with glass fibers and copper clad on at least one of its surfaces, or an innerlayer clad with copper, as used for multilayer circuit fabrication. As is known in the art, the epoxy can be substituted or mixed with other resins for specific purposes.

In the manufacture of a double-sided printed circuit board, a first step comprises the formation of through-holes by drilling or punching or any other method known to the art. Following formation of the holes, it is desirable to employ the conventional steps of rinsing with an organic solution to clean and degrease the board. This is followed by desmearing the hole walls with sulfuric acid, chromic acid, permanganate, or plasma etching. Following desmearing, the circuit board base material is conventionally treated with a glass etchant that removes glass fibers extending into the holes from the hole walls. This is followed by a solution that neutralizes acid residues and then the hole walls are conditioned to promote catalyst adsorption. Such solutions are often referred to as conditioners and typically comprise an aqueous alkaline surfactant solution for cleaning soil and an amine to condition the hole wall. The material of choice for the step of conditioning is a polyelectrolyte. Polyelectrolytes are typically polymers having a plurality of charged groups along their chains where the charged groups carry a charge opposite from the charge of a dispersed particle to adsorbed onto the substrate. Polyelectrolytes used in metal plating procedures are disclosed in numerous publications including U.K. Patent No. 1,338,491 and U.S. Pat. Nos. 4,478,883; 4,554,182; 4,701,350 and 4,969,979, each incorporated herein by reference. The step of treatment with the polyelectrolyte, by itself, is old in the art and does not constitute a part of the invention.

Following the pretreatment procedures described above, the next step in the process comprises treating the substrate with a dispersion of carbonaceous particles to which, in accordance with the invention, a copper dissolution agent is added. As aforesaid, the particles may be of carbon black (amorphous) or may be of graphite (crystalline), or a mixture of the two. The carbon may be present in the dispersion in an amount of from about 0.1 to about 20% by weight of the dispersion, and preferably in an amount of from about 0.5 to about 10% by weight of the dispersion. The carbon may have a mean particle size within a range of from about 0.05 to about 50 microns and preferably is of a particle size within a range of from about 0.3 to 5.0 microns. From the perspective of performance, particles from the smaller end of the size range are preferred. Graphite particles of suitable size can be prepared by the wet grinding or milling of raw graphite having a particle size greater than 50 microns, to form a slurry of smaller particles. Graphite particles of suitable size can also be formed by graphitizing already-small carbon-containing particles.

If both carbon black and graphite are used, the carbon black may have a substantially smaller particle size than the graphite. The ratio of graphite to carbon black may vary from about 1:100 to about 100:1, and preferably from about 1:10 to about 10:1.

The carbon black useful herein can be substan 5,139,642 incorporated herein by reference. Several commercial carbon blacks contemplated to be useful herein include CABOT MONARCH 1300, sold by Cabot Corporation, Boston, Mass.; CABOT XC-72R Conductive, from the same manufacturer; ACHESON ELECTRODAG 230, sold by Acheson Colloids Co., Port Huron, Mich.; COLUMBIAN RAVEN 3500, made by Columbian Carbon Co., New York City, N.Y.; and other conductive carbon blacks having similar particle sizes and dispersion characteristics.

The graphite useful herein can be substantially as described in U.S. Pat. No. 5,139,642 and may be either synthetic or naturally occurring. Suitable commercial graphites and graphite dispersions contemplated to be useful herein include: ULTRAFINE GRAPHITE, sold by Showa Denko K.K., Tokyo, Japan; AQUADAG E; MICRO 440, sold by Asbury Graphite Mills Inc., Asbury, N.J.; GRAPHITE 850, also sold by Asbury; GRAFO 1204B, sold by Metal Lubricants Company, Harvey, Ill.; GRAPHOKOTE 90, sold by Dixon Products, Lakehurst, N.J.; NIPPON AUP (0.7 micron), sold by Nippon Graphite Industries, Ltd., Ishiyama, Japan; and others having similar electrical and dispersion characteristics. Synthetic graphite is preferred. Synthetic graphite is formed by heat treating (graphitizing) a carbon source at temperatures exceeding 2400° C.

Another desirable component of some of the compositions of the present invention may be a water soluble or dispersible binding agent to bind the carbon particles. The binding agent is believed to assist the dispersed carbon particles in adhering to the surface of the non-conductive (i.e., dielectric) substrate which is to be made conductive for electroplating. The binding agent may be present as from about 0% to about 15% by weight, and preferably from about 0.2 to about 10% by weight.

The binding agent is preferably a natural or synthetic polymer, polymerizable monomer, or other viscous or solid material (or precursor thereof) that is capable of both adhering to the carbon particles and of receiving an anionic dispersing agent (as described below). For example, the binding agent may be a water soluble or water dispersible material selected from the group consisting of mono- and polysaccharides (or, more broadly, carbohydrates and anionic polymers). Monosaccharide binding agents include tetroses, pentoses, and hexoses. Polysaccharide (including disaccharide and higher saccharides) binding agents contemplated for use herein include sucrose, maltose, fructose, lactose, stachyose, maltopentose, dextrin, cellulose, corn starch, other starches, and polysaccharide gums. Polysaccharide gums include agar, arabic, xanthan, pectin, alginate, tragacanath, dextran and other gums. Derivative polysaccharides include cellulose acetates, cellulose nitrates, methylcellulose, and carboxymethylcellulose. Hemicellulose polysaccharides include d-gluco-d-mannans, d-galacto-d-gluco-d-mannans, and others. Anionic polymers include the alkylcelluloses or carboxyalkylcelluloses, their low- and medium-viscosity alkali metal salts (e.g. sodium carboxymethyleellulose, or "CMC"), cellulose ethers, and nitrocellulose.

The acrylics that may be used herein for use as binding agents include polymerizable monomers and polymers, for example, emulsion polymers commonly known as acrylic latices. The monomers include acrylamide, acrylonitrile, acrylic acid, methacrylic acid, glycidyl methacrylate, and others. The acrylic polymers include polymers of any one or more of the foregoing monomers; polyacrylamide polymers; polyacrylic acid; acrylic ester polymers such as polymethyl acrylate, poly-ethyl acrylate, polypropyl acrylate, polyisopropyl acrylate, polybutyl acrylate, polyisobutyl acrylate, polypentyl acrylate, polyhexyl acrylate, polyheptyl acrylate, polyoctyl acrylate, and polyisobornyl acrylate; and other polyacrylates.

Other binding agents may also be used such as vinyl resins including polyvinyl acetates, polyvinyl ethers, polyvinyl chlorides; pyrrolidone resins such as poly(N-vinyl-2-pyrrolidone); polyols such as polyvinyl alcohols and other materials that may be used as binding agents including polyethylenimine, methylaminoethyl resins, alkyltrimethylammonium chlorides, and others. Esters of olefinic alcohols, aminoalkyl esters, esters of ether alcohols, cycloalkyl esters, and esters of halogenated alcohols.

A practical upper limit to the amount of binding agents used is that amount which materially interferes with the conductivity of the resulting conductive coatings by diluting the conductive solids in the composition after it is deposited as a film.

Another component in the dispersion may be an anionic dispersing agent. The anionic dispersing agent has a hydrophobic end and a hydrophilic end. It functions by surrounding the bound carbon particles and causing the bound particles to disperse. It is believed that the hydrophobic end of each anionic dispersing agent is attracted to the hydrophobic region of the binding agent, thereby causing the anionic end of the anionic dispersing agent to stick out into the aqueous surrounding dispersing medium. When each bound carbon particle has sufficient dispersing agent bound to it, the sphere of anionic charges surrounding each particle causes the particles to repel one another, and thus, to disperse.

The amount of anionic dispersing agent is an amount sufficient to cause the bound carbon particles to disperse in the aqueous dispersing medium. The amount used is dependent upon the size of the carbon particle and the amount of binding agent bound thereto. To determine the amount of dispersing agent that is required in any particular case, one of ordinary skill in the art can begin by adding ever increasing amounts of dispersing agent to the bound carbon particles until a sufficient amount is added to cause the particles to disperse. This amount of dispersing agent is the minimum effective amount of dispersing agent. Increasing amounts of dispersing agent may be added without adversely affecting the dispersion of the carbon particles. To ensure that the particles remain dispersed, one could add a ten percent greater amount of dispersing agent than is needed. For example, the anionic dispersing agent may be present as from about 0% to about 10% by weight, and preferably about 0.01% to about 5% by weight. A practical upper limit to the amount of anionic dispersing agents used is that amount which materially interferes with the conductivity of the resulting conductive coatings by diluting the conductive solids in the composition.

Suitable anionic dispersing agents include acrylic latices, aqueous solutions of alkali metal polyacrylates, and similar materials.

An optional component of the composition of the present invention is a surfactant. One function of the surfactant is to decrease the surface tension of the aqueous dispersing medium such that the aqueous dispersing medium containing the dispersed carbon particles is able to freely penetrate into the through holes. A second function of the surfactant is to wet the surfaces of the polymeric and glass substrates. This facilitates the coating of these surfaces with the carbon dispersion. The amount of surfactant that is used in any particular case will vary depending upon the surfactant itself. When used, the amount of the surfactant may vary from about 0.01% to about 10% by weight, and preferably in the amount of from about 0.02% to about 3% by weight.

Suitable surfactants for use in the present invention include TRITON X-100, sold by Rohm and Haas Co., Philadelphia, Pa.; FLUORAD® FC-120, FC-430, FC-431, FC-129, and FC-135 anionic fluorochemical surfactant; sold by Minnesota Mining & Manufacturing Co., St. Paul, Minn.; DARVAN NO. 1, sold by R. T. Vanderbilt Co.; ECCOWET LF, sold by Eastern Color and Chemical; PETRO ULF, sold by Petro Chemical Co. Inc.; POLYTERGENT B-SERIES surfactant, sold by Olin Corporation; and others.

Another component of the composition is an aqueous dispersing medium. The phrase "aqueous dispersing medium," as used herein, includes any solvent that is from 80 to 100% water wherein the balance of the material is a water soluble organic composition. Typical water soluble organic compositions include the low molecular weight alcohols, such as methanol, ethanol, and isopropanol. Additional organic components include solvents such as dimethylsulfoxide, tetrahydrofuran, and ethylene or propylene glycol. Preferably, the aqueous dispersing medium is 100% water.

The composition and method of the present invention is capable of being run over a wide pH range such as from about 3.0 to 13.0, but preferably has a pH of from about 8 to 13.0 and more preferably, a pH within the range of 8.5 to 12. The pH may be maintained by a pH buffer. The buffer functions by precluding or minimizing changes in pH such as may occur during the course of a run as a large number of boards are treated with the composition of the present invention. The maintenance of a constant or nearly constant pH insures the composition is reproducible from board to board.

In accordance with the invention, a copper etchant or complexing agent compatible at the pH of the carbonaceous dispersion is added to the dispersion so that in use, the copper cladding may be etched simultaneously with the formation of the graphite coating. Copper etchants and complexing agents suitable for use within the useful pH range are known in the art and disclosed in numerous publications. A preferred class of materials are those materials used as complexing agents in electroless copper plating solutions. Such materials are disclosed in numerous prior publications including U.S. Pat. Nos. 3,728,137 and 3,790,392 incorporated herein by reference. Such materials include, by way of example, Rochelle salts, the sodium salts of ethylenediamine tetraacetic acid, nitriloacetic acid and its alkali metal salts, triethanolamine, modified ethylenediamine tetraacetic acids such as N-hydroxyethylene diamine triacetate, hydroxyalkyl substituted dialkaline triamines such as pentahydroxypropyldiethylenetriamine and the like. One preferred class of amines are the hydroxyalkyl substituted tertiary amines such as tetrahydroxypropylethylene diamine, pentahydroxypropyl diethylene triamine, trihydroxypropyl amine, trihydroxypropyl hydroxyethylethylene diamine and the like. Another suitable class of materials are those materials used as relatively mild copper etchants, especially the amine based etchants. Such etchants are known in the art and disclosed in numerous publications including U.S. Pat. Nos. 3,837,945 and 4,280,887, incorporated herein by reference. Such materials include, by way of example, ammonia and ammonium salts such as tetraamine cupric and cuprous salts and ammoniacal peroxy compounds as disclosed in the aforesaid patents. Aggressive etchants such as ferric chloride and chromic/sulfuric etchants are generally undesired for purposes of this invention. Preferably, the material used to add to the dispersant is one that is capable of complexing with the copper cladding to theoretically remove only the top monolayer of the copper cladding. However, for purposes of the invention, the dissolution agent is one that should be of a strength sufficient to etch from about 1 to 100 microinches of copper and preferably, from 5 to 25 microinches of copper during that period of time that the carbonaceous coating material is in contact with the copper. Obviously, in addition to the selection of the dissolution agent, the depth of penetration of the dissolution agent is controlled by pH and concentration.

In accordance with the preferred embodiment of the invention, the additive to the dispersion is ammonium hydroxide as ammonium hydroxide provides adequate removal of copper ions from the surface of the cladding and may be used for close pH control.

The etchant is added to the dispersion in an amount sufficient to etch copper as described above. Preferably, the etchant is used in an amount of from about 0.1 to 10 percent by weight of the dispersion and more preferably, in an amount of from 0.5 to 5 percent by weight of the dispersion. The method of adding the amine is by simple mixing and does not constitute a part of this invention.

The carbonaceous dispersion of the invention would be used in conventional manner. Using a copper clad substrate having apertures therein for purposes of illustration, the board would be cleaned, rinsed, treated with a conditioner that is preferably a polyelectrolyte conditioner, and then treated with the dispersion. The dispersion would be applied to the substrate to form a coating thereon. Thereafter, the coating would be dried to remove the dispersing medium, and optionally fixed though this step does not appear to be critical for practice of the subject invention. The carbonaceous coating would then be removed from metallic copper surfaces which is facilitated by the step of simultaneously etching the copper with the dispersion during the formation of the particulate coating. For this reason, the carbonaceous coating may be removed without an additional etching or other chemical treatment step if desired. For example, pressure spraying may be used to remove the carbonaceous coating without a step of etching the copper though an optional etching step may be used in the process if desired.

Following formation of the carbonaceous coating and removal of the same from copper surfaces, the part is ready for electroplating. The electroplating procedure is conventional. The part to be plated is used as a cathode in a conventional electroplating cell. Current density is conventional and varies typically within a range of from 10 through 40 amps/ft.$^2$. In practice, it is convenient to initiate the current as the part enters the plating solution. A preferred current density range is from 15 to 30 amps/ft$^2$. The plating solution is maintained at a temperature ranging between room temperature and about 100° F. Plating is continued for a time sufficient to form a deposit of desired thickness. For circuit board manufacture, a desired thickness may range between 0.5 and 2.0 mils, typically from 1 to 1.5 mils. A plating time of from 15 to 90 minutes would typically be required to obtain a deposit of the preferred thickness within the preferred range of current densities. The deposit formed by the process is uniform in thickness, free of defects and strongly bonded to the surface of the nonconductor over which it is plated. Bond strength is satisfactory to withstand solder shock testing as conventionally used in printed circuit board manufacture.

EXAMPLE 1

A dispersion is prepared by providing a preformed graphite dispersion obtained from Acheson Chemical Company and identified as Aquadag E. This dispersion contains about 3.0 percent by weight particulate graphite having a mean particle size of about 1 micron. The pH of the dispersion is adjusted to 10.5 by addition of ammonium hydroxide which functions both as an etchant for copper and as a pH adjustor.

EXAMPLE 2

The following example illustrates the manner in which a printed circuit board substrate may be electroplated in accordance with the procedures of this invention. All proprietary chemicals identified in the example are available from Shipley Company, L.L.C. of Marlborough, Mass.

A multilayer circuit board having 4 circuit layers with an array of 14 and 36 mil. holes may be subjected to the following procedure.

Step 1 Pre-clean and condition:

a. immerse in a proprietary organic solvent identified as MLB 211 at 160° F. for 5 minutes and water rinse;

b. desmear the hole walls with a proprietary permanganate solution identified as MLB 213 Promoter at a temperature of 180° F. for 6 minutes and water rinse;

c. neutralize acid residues by treatment with a proprietary alkaline solution identified as Neutralizer 218-1 at room temperature for 3 minutes and water rinse;

d. condition the hole walls using a proprietary quaternary amine polyelectrolyte solution identified as XP-9503 at a temperature of 105° F. for 5 minutes and water rinse.

Step 2 Form conductive particle coating:

a. apply the carbonaceous dispersion of Example 1 to the substrate by contact of the substrate with the dispersion in a manner to ensure penetration of apertures by the dispersion. Contact may be for 5 minutes at room temperature;

b. dry the coating on the substrate by placing the substrate in an air circulating oven maintained at 75° C. for 30 minutes.

Step 3 Microetch copper surfaces and remove dispersion coating from copper cladding.

Spray the board with water at a pressure of about 30 lbs./in$^2$ for 1 minute. Inspection of the copper cladding will reveal that the dispersion coating has been removed from the surface leaving a clean copper surface available for metal plating.

Step 4 Electroplate:

Electroplate copper from an acid copper electroplating bath identified as ELECTROPOSIT® 1100 acid copper at a current density of 20 amps./ft.$^2$ and at a temperature of 70° F. for 1 hour and water rinse to obtain a deposit having a thickness of about 1.5 mils.

EXAMPLE 3

Repeat the procedure of Example 2 without addition of the ammonium hydroxide to the graphite dispersion. Form the coating of the graphite dispersion and following the step of spraying to remove the graphite coating, inspection will reveal that the coating adheres to portions of the copper cladding. If the procedure is again repeated and the following formation of the graphite coating, the part is immersed in a microetch for 1 minute at 120° F., inspection of the copper will reveal that the graphite has been removed from the surface of the copper.

We claim:

1. A process for depositing metal on a substrate having copper and non-metallic regions, said process comprising the steps of providing an aqueous dispersion of carbonaceous particles containing an etchant for the copper regions in an amount of at least 0.1 percent of the dispersion, contacting said substrate with said dispersion to form a coating of said dispersion over all surfaces of said substrate and to simultaneously dissolve the top surface of said copper regions, and in the absence of an additional chemical etching or other chemical treatment step, removing carbonaceous coating from the copper regions of the substrate and electroplating metal on said substrate from an electrolytic metal plating solution.

2. The process of claim 1 where the carbonaceous particles are selected from the group consisting of carbon black and graphite.

3. The process of claim 2 where the carbonaceous particles are carbon black.

4. The process of claim 2 where the carbonaceous particles are in the form of graphite.

5. The process of claim 1 where the carbonaceous coating is removed from copper regions by contact with a pressurized water spray.

* * * * *